US006404598B1

(12) United States Patent
Nayak et al.

(10) Patent No.: US 6,404,598 B1
(45) Date of Patent: *Jun. 11, 2002

(54) FLEXIBLE CIRCUIT ROUTING CONFIGURATION FOR A FINE/COARSE POSITIONER FOR A TAPE DRIVE

(75) Inventors: Ashok Babubhai Nayak, Glendora; James Mark Decot, Fountain Valley, both of CA (US)

(73) Assignee: Seagate Technology LLC, Scotts Valley, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/401,100

(22) Filed: Sep. 22, 1999

Related U.S. Application Data

(60) Provisional application No. 60/101,342, filed on Sep. 22, 1998.

(51) Int. Cl.$^7$ ............................. G11B 5/56; G11B 21/24
(52) U.S. Cl. ....................................... 360/291; 360/256.1
(58) Field of Search .............................. 360/251.1, 260, 360/261.1, 290, 291, 241.1, 245.8

(56) References Cited

U.S. PATENT DOCUMENTS

| 5,264,979 A | * 11/1993 | Schandl et al. ............. 360/109 |
| 5,434,732 A | * 7/1995 | Schwarz et al. ............ 360/109 |
| 5,448,438 A | * 9/1995 | Kasetty ....................... 360/106 |
| 5,519,554 A | * 5/1996 | Todd et al. .................. 360/106 |
| 5,615,068 A | * 3/1997 | Matsuda et al. ............ 360/106 |
| 5,631,788 A | * 5/1997 | Richards ..................... 360/104 |
| 5,739,984 A | * 4/1998 | Eckberg ...................... 360/106 |
| 5,818,667 A | * 10/1998 | Larson ........................ 360/106 |
| 5,862,014 A | * 1/1999 | Nute ........................... 360/104 |
| 5,886,858 A | * 3/1999 | Yanagihara ................. 360/106 |
| 5,978,172 A | * 11/1999 | Nayak et al. ............ 360/78.02 |
| 5,986,854 A | * 11/1999 | Vollmann .................... 360/105 |
| 6,078,483 A | * 6/2000 | Anderson ................. 360/261.1 |

* cited by examiner

Primary Examiner—William Klimowicz
(74) Attorney, Agent, or Firm—Merchant & Gould P.C.

(57) ABSTRACT

Disclosed is a method of increasing the transfer rate of a magnetic tape drive by employing at least one head gap per rail. A flexible printed circuit provides communication between main control circuitry of the tape drive and the head positioning apparatus. The flex circuit provides flexible control loops that correspond to the translation range of the head positioning apparatus. In a preferred embodiment, the flex circuit includes a fine positioner loop and a coarse positioner loop.

20 Claims, 9 Drawing Sheets

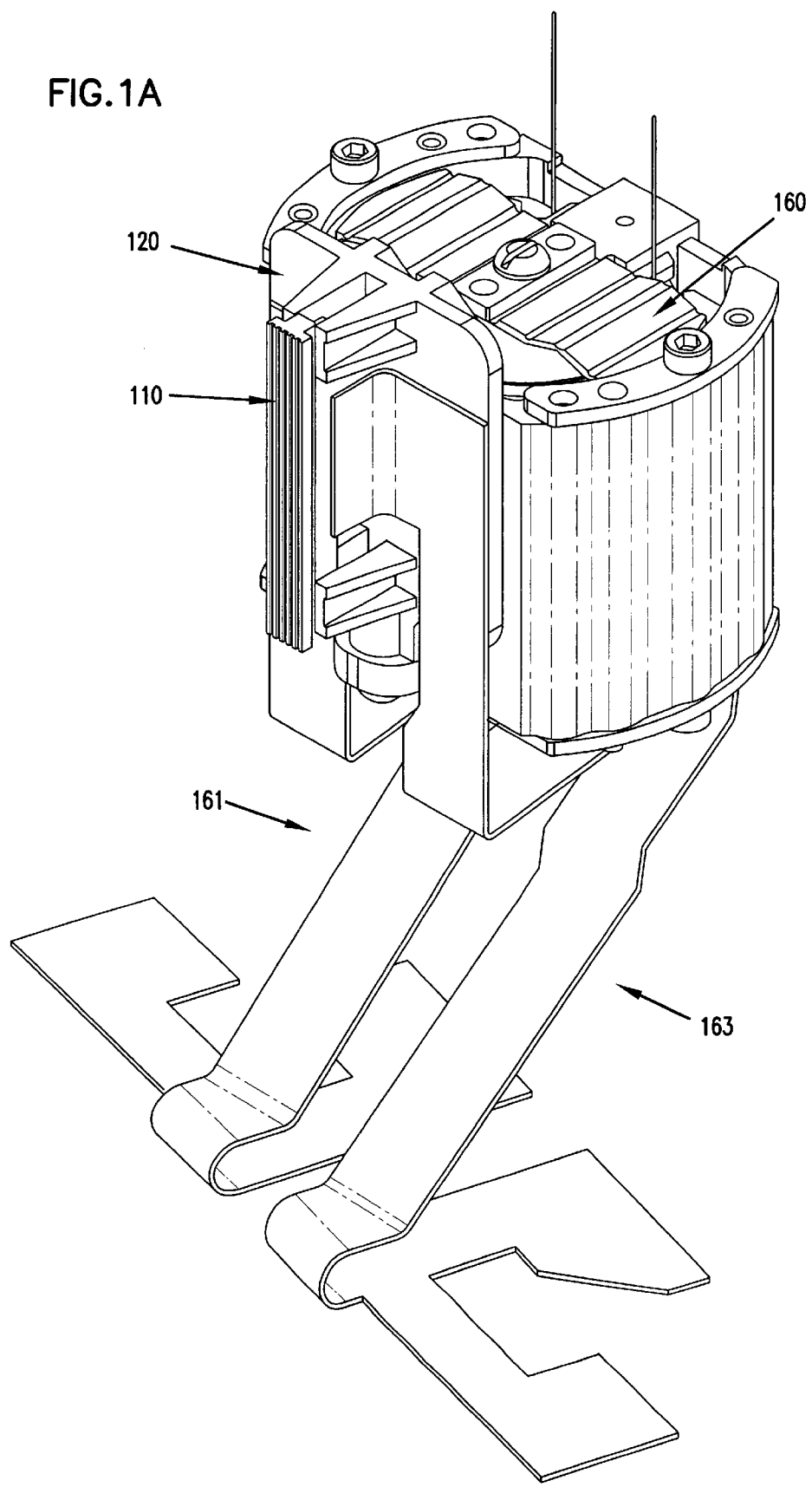

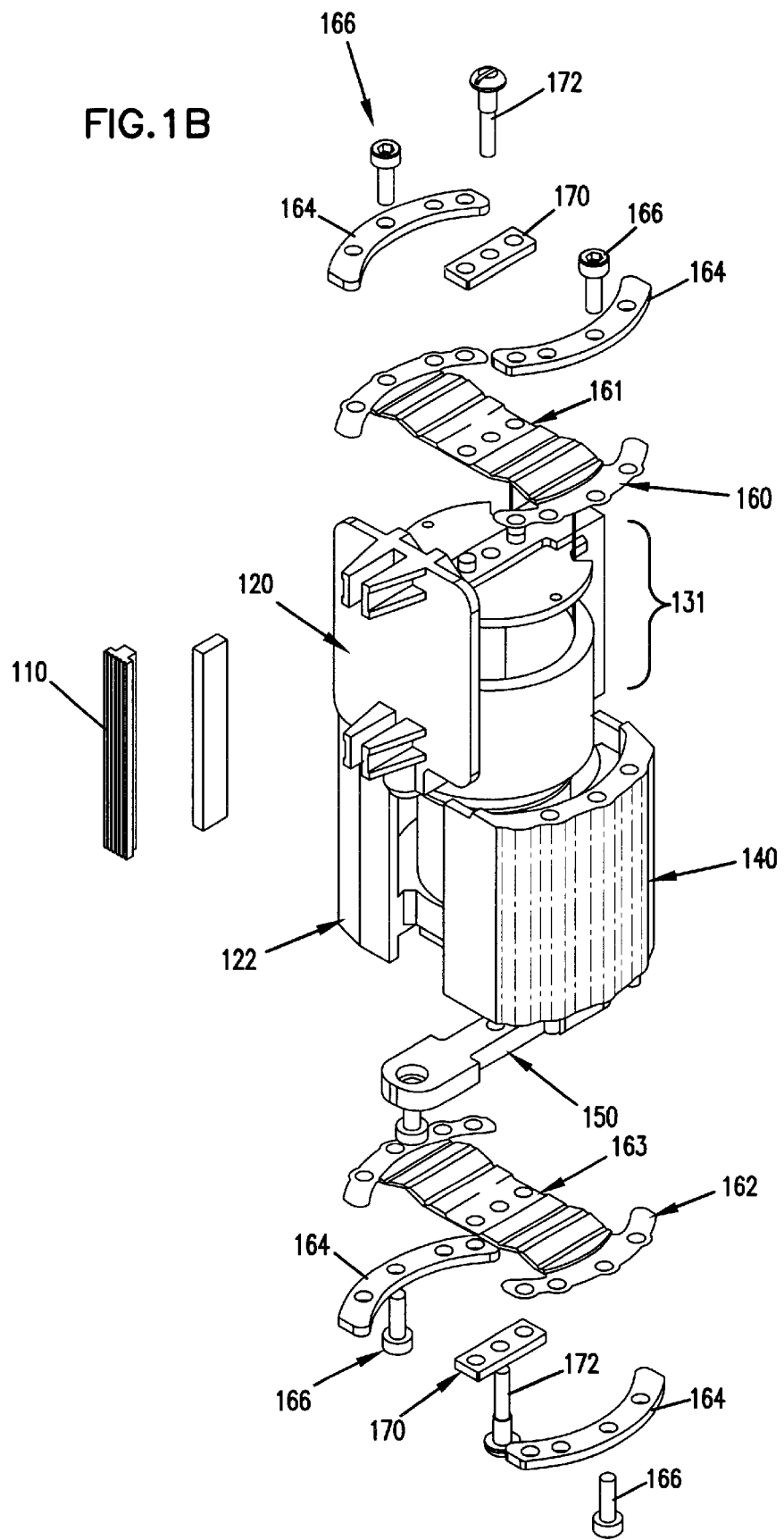

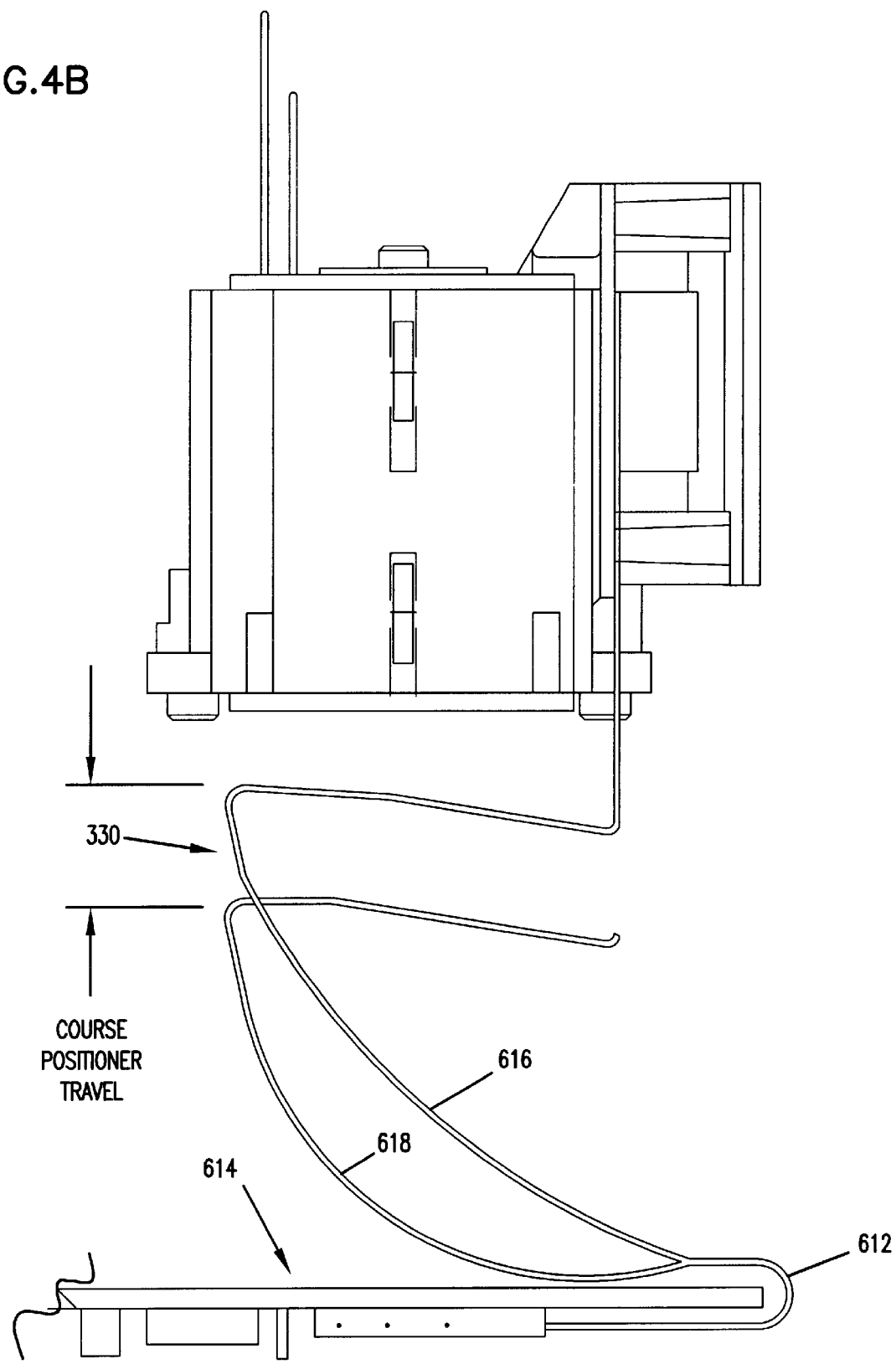

FLEXIBLE CIRCUIT ROUTING CONFIGURATION FOR A FINE/COARSE POSITIONER FOR A TAPE DRIVE

RELATED APPLICATIONS

This application claims priority to provisional application Ser. No. 60/101,342 filed Sep. 22, 1998, entitled "FLEXIBLE CIRCUIT ROUTING CONFIGURATION FOR A FINE-COARSE POSITIONER".

FIELD OF THE INVENTION

The invention relates generally to tape drives and more specifically to tape drives employing fine-coarse positioners. More specifically, the invention relates to tape drives using fine-coarse positioners and having more than one head gap to provide enhanced bandwidth.

BACKGROUND OF THE INVENTION

Magnetic tape data storage devices, or tape drives, have long been used for storing large quantities of computer data. More recently, as disc drives have become increasingly faster, tape drives have become more popular for long term data storage and backup.

The storage and recovery of data from a tape drive is accomplished via a gap in the read/write head. The data is stored in the form of magnetic flux reversals within the magnetic coating on the tape. To maximize flux reversal sharpness, and therefore maximize the amplitude of the data pulses read, the length of the head gap is aligned as accurately as possible with the tape as it moves laterally past the head.

Frequently, tape drives include a multi gap head, with one head gap used to write data and another head gap used to read the just-written data to ensure accuracy. The purpose of the second head gap is to read or verify the written data recorded by the first head gap while the tape is in motion in a forward direction. Similarly, while the tape moves in a reverse direction, the second head gap writes the data and the first head gap verifies the data. The terms forward and reverse direction, as well as the notations first and second head gap are relative terms defined in relation to each other.

If it is desired that the tape drive could read/write with the tape moving in either direction, an additional head gap is required. In order to provide an optimal interface between the head and the tape, the head gap is raised in relation to the rest of the head. This raised area is better known as a rail. A head with only one gap would have a single rail while, for example, a head with two gaps would have two rails. The distance between the rails is as short as possible and is currently limited by manufacturing and fabrication technology.

As long as there is only one gap per rail, the transfer rate of a tape drive is a function of the linear speed of the tape moving past the head and the recording density, or bits per inch, of the data present on the tape. The transfer rate represents the amount of data that can be recorded or read in a given period of time. Unfortunately, both linear tape speed and recording density are limited by available technology. One solution is to increase the transfer rate by providing multiple writing heads. Consequently, a tape drive with a very high transfer rate would have multiple gaps per rail.

While this would certainly increase the transfer rate, certain mechanical difficulties arise in the design of a flexible printed circuit for a head that would support an increased transfer rate. The purpose of the flexible printed circuit is to operably connect the head gap to a main printed circuit board of the tape drive. For each magnetic gap, there are five circuits or lines required between the head gap and the main printed circuit board, i.e., 2 for the read gap (read+ and read −); 2 for the write gap (write+ and write−); and 1 shield or ground.

Thus, the circuitry requirements for even a single gap head are significant. If the single gap head was required to read and write simultaneously, the circuitry requirements double. It is anticipated, however, that future tape drives will have substantially more gaps per rail as expected transfer rates reach the 15 to 20 megabyte per second range.

For example, a tape drive with 10 head gaps per rail is anticipated. Such a head would require 50 circuits or lines. If the drive has read and write capabilities, the head would utilize 100 circuits. As the flexible printed circuit board becomes larger, it becomes less flexible, which can be a significant detriment as the head is required to move laterally across the width of the tape to access and follow a desired data track. A typical tape has about 400 data tracks across the width of the tape.

A need remains for a tape drive with a high transfer rate. A need remains for a tape drive that minimizes the stiffness caused by substantial flexible printed circuits.

SUMMARY OF THE INVENTION

A first aspect of the invention is found in a method of increasing the transfer rate of a magnetic tape drive that has a fine positioner, a coarse positioner, and main control circuitry. The method includes providing a head having at least one rail, wherein the rail has at least one head gap, mounting the head in an assembly including a fine positioner and a coarse positioner, and operatively connecting the head to the main control circuitry of the tape drive via a flexible printed circuit that is configured to provide a predetermined level of stiffness.

A second aspect of the invention is found in a magnetic tape drive having an increased transfer rate. The drive includes a magnetic head having a minimum of two rails, each rail having a plurality of head gaps; wherein the head is arranged within and positioned by a head positioning apparatus including a fine positioner and a coarse positioner. The drive also includes flexible printed circuits that provide communication between the magnetic head and main control circuitry; wherein the flexible printed circuits have at least one loop that corresponds to the translation range of the head positioning apparatus.

A third aspect of the invention is found in a flex circuit for coupling a head of a tape drive to a main circuit board that provides translation commands to the head of the tape drive. The flex circuit includes a fine positioner loop having a shape that is designed to reduce stiffness in the flex circuit and a coarse positioner loop coupled to the fine positioner loop, the coarse positioner having a shape that is designed to reduce stiffness in the flex circuit.

These and other features as well as advantages that characterize the present invention will be apparent from a reading of the following detailed description and a review of the associated drawings.

BRIEF DESCRIPTION OF THE FIGURES

FIG. 1a is a perspective view of a positioner according to a preferred embodiment of the invention.

FIG. 1b is an exploded perspective view of the positioner shown in FIG. 1.

FIGS. 3a and 3b are perspective views illustrating the flexible printed circuitry used in conjunction with the fine posiitoner shown in FIG. 1a.

FIG. 4b is a side view of the posiitoner shown in FIG. 4a without the loop bracket attached.

DETAILED DESCRIPTION

Figure 2:
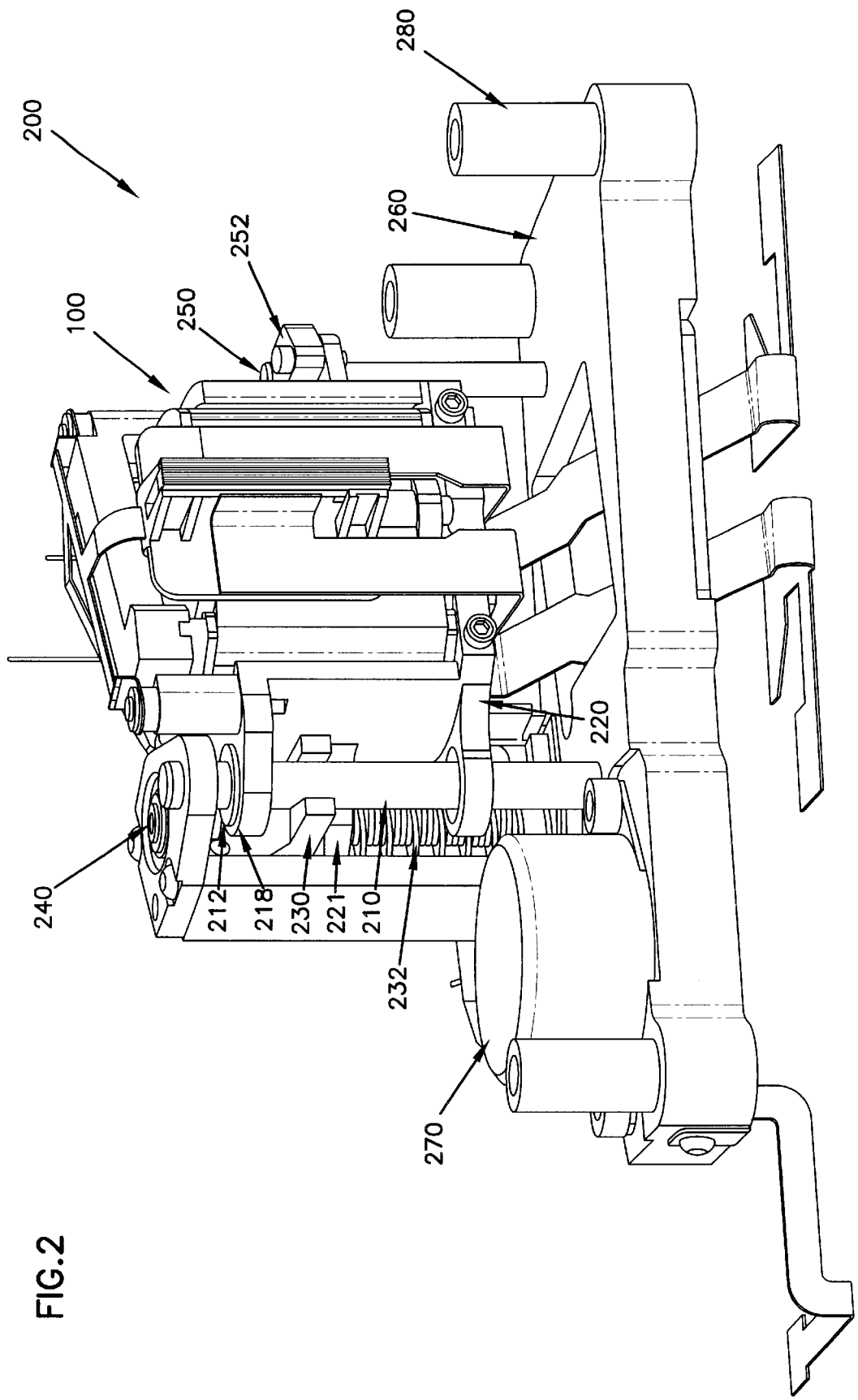
FIG. 2 is a perspective view of the positioner shown in FIG. 1a mounted on a coarse posiitoner according to a preferred embodiment of the present invention.

A magnetic recording head is located and controlled via a head positioner. In a preferred embodiment, the positioner includes both a fine positioner and a coarse positioner. The fine positioner moves the head to follow either a track centerline or for short distance track seeks. The maximum distance that the fine positioner can travel is referred to as its stroke. Conversely, the coarse positioner moves the head during seeks when the required distance is greater than the stroke of the fine positioner. A positioner utilizing both a fine and a coarse positioner is described, for example, in commonly assigned U.S. Pat. No. 5,191,492, which is incorporated herein by reference. Preferably, the fine positioner functions under closed-loop servo control while the coarse positioner utilizes open-loop control.

In a preferred embodiment of the invention, the fine positioner has a stroke of six tracks. A six-track stroke means that the fine positioner can be used to move the head up to three tracks in either the plus or minus direction. For example, if the head is located at track #3, the fine positioner can move the head from track #0 to track #6. If a longer seek is needed, the coarse positioner is used.

As illustrated in FIGS. 1a and 1b, fine positioner 100 includes a magnetic head 110 and head carriage 120. The magnetic head 110 is preferably retained in a forked shaped portion of the head carriage 120 preferably by an adhesive. Of course other types of fasteners may be used to fasten the magnetic head 110 to the head carriage 120 such as an interference fit or mechanical fasteners such as screws, for example. Also included in the fine posiitoner 100 is a voice coil motor 131 including a voice coil portion 130 and outer winding 140. Only the voice coil portion 130 is attached to the head carriage 120 to translate with the head carriage 120. The voice coil portion 130 is suspended in a magnetic field produced by magnets (not shown) in the outer winding 140 of the voice coil motor. Also included in the fine positioner 100 are bridge brackets 150, a first and second flexure 160, 162, outer mounting brackets 164, screws 166, inner mounting brackets 170 and screws 172. As will be described in detail hereinafter, flexures 160, 162 and brackets 164 are fixedly mounted on a coarse positioner. Magnetic head 110, head carriage 120, voice coil portion 130 bridge bracket 150, inner mounting bracket 170 and screws 172 form the moving mass of the fine positioner 100 as is well known to those of ordinary skill in the art.

FIG. 2 illustrates the fine positioner 100 shown in FIGS. 1a, 1b mounted on a coarse positioner 200. The coarse positioner includes a coarse positioner bracket 220 on which the fine positioner 100 is supported. The coarse positioner bracket 220 is mounted about a guide shaft 210 by two precision bushings 212 (of which only one is illustrated). A middle arm 221 of the coarse positioner bracket 220 is held in contact with a threaded nut 230 via a preload spring 232. Consequently, threaded nut 230 and coarse positioner bracket 220 will remain in physical contact as long as any externally applied forces are less than the applied force by the preload spring 232. Threaded nut 230, which is driven by lead screw 240, translates the coarse positioned bracket 220 as the lea screw 240 rotates. Threaded nut 230 includes three pads that rest against the top surface of the middle arm 221 of the coarse positioner bracket 220. The spring pushes the top surface of the middle arm 221 of the bracket against the threaded nut 230.

Since the coarse positioner 200 preferably includes two precision bushings 212 and a guide shaft 210, a three-point contact design allows threaded nut 230 to adjust in accordance with parallelism tolerances between guide shaft 210 and lead screw 240. Therefore, threaded nut 230 floats on three points as it moves and retains a three-point contact with coarse positioner bracket 220. Coarse positioner 200 also includes an anti-rotation shaft 250 and anti-rotation guide 252 that prevent the coarse positioner bracket 220 from rotating as lead screw 240 rotates.

An actuator bracket 260 is used to support all of the coarse positioner 200 components. Guide shaft 210 is supported at both ends to provide the preferred structural rigidity to coarse positioner bracket 220 as it translates up and down. Lead screw 240, which is driven by a stepper motor 270, is mounted on actuator bracket 260. Actuator bracket 260 also supports a ball bearing system (not shown) for lead screw 240 and also includes three circular posts 280 that are attached to the main plate of the tape drive with a spring load (not shown) at each post 280 to create an adjustable three-point mounting system. One of the posts is fixed and functions as a pivot during the head alignment process.

With reference to FIGS. 1a and 1b, the moving mass is supported by two flexures 160, 162, one at the top of the fine positioner 100 and one at the bottom. Flexure 160 includes a center portion 161 which is attached to the head carriage 120 using inner mounting bracket 170 and screws 172. Similarly, bottom flexure 162 includes a center portion 163 that is attached to bridge bracket 150 using inner mounting bracket 170 and screw 172. Both flexures 160, 162 are fixed at the outer diameter and are attached to outer winding 140 of the voice coil motor.

A control system utilizing a single voice coil motor is described in commonly assigned U.S. Pat. No. 5,901,008, which is incorporated herein by reference. When a command is given to fine positioner 100 to move, the voice coil motor must produce a particular force. Preferably, this force is sufficient to accelerate head 110 and head carriage 120 and to overcome the stiffness of the suspension system. Most of the suspension system stiffness comes from flexures 160, 162 and the flexible printed circuits 161 and 163 used to operatively connect fine positioner 100 to the tape drive's main control circuitry.

Likewise, when coarse positioner 200 is commanded to move, it must receive enough power to overcome the inertia of the moving head and also to overcome the stiffness of the coarse positioner system. This stiffness largely comes from the preload spring 232 on the threaded nut 230 and the stiffness of the flexible printed circuits 161, 163 used for communication between the head and the main control circuitry. Consequently, the flexible printed circuits play a significant role in the stiffness of both the fine positioner and the coarse positioner. As noted before, these flexible printed circuits become even stiffer as they grow in size. In order to increase the transfer rate of the tape drive, the flexible printed circuits increase due to the increased number of heads as previously described. It is therefore necessary to design the tape drive such that the flexible printed circuits are configured to minimize their impact on stiffness against which the positioner translates.

Figure 3A:
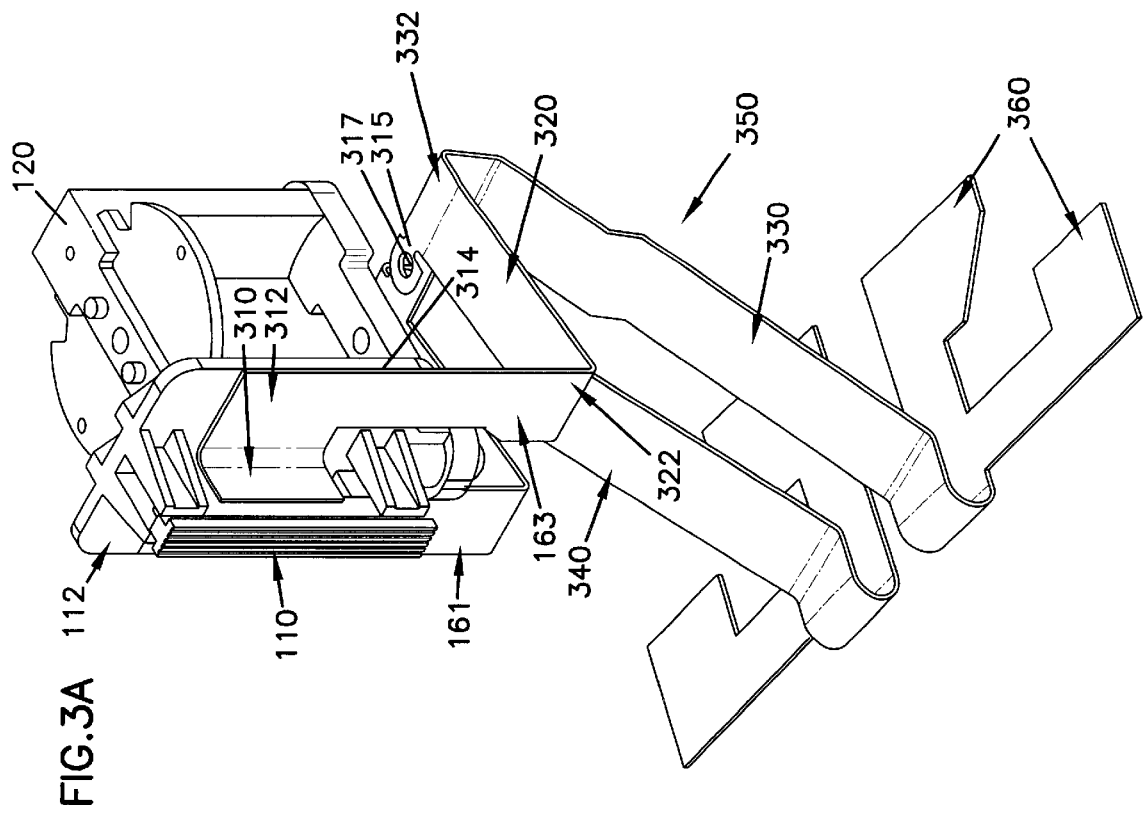
Figure 3B:
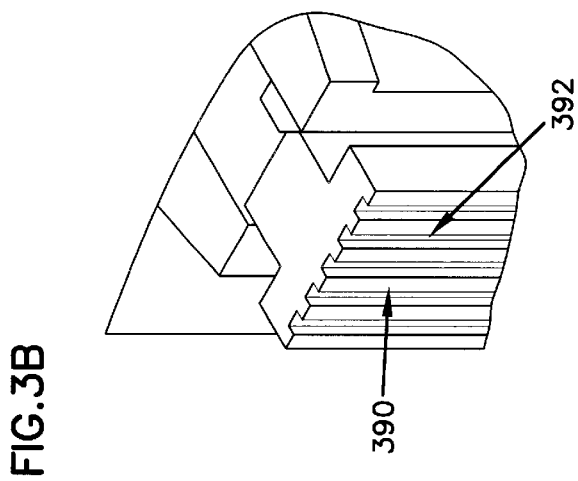

In the preferred embodiment illustrated, a first flexible circuit includes all of the necessary circuitry for each head gap located on the first rail while a second flexible circuit has the necessary circuitry for the head gaps present on the second rail. FIG. 3*a* is a perspective view illustrating the flexible printed circuitry used in conjunction with the posiitoner shown in FIG. 1*a*. As illustrated in FIG. 3*a*, the front portion of each flexible circuit 161, 163 begins at magnetic head 110. FIG. 3*b* is an enlarged view of a portion of head 110, illustrating the geometric relationship between forward gap 390 and reverse gap 392. The flexible circuit includes forward flexible circuit 340 and reverse flexible circuit 350. For simplicity, only reverse flexible circuit 350 will be discussed herein, as forward flexible circuit 340 is essentially identical.

Reverse flexible circuit 350 attaches to magnetic head 110 at attachment point 310. Ninety degree bend 312 permits reverse flexible circuit to be attached to the head carriage 120 at attachment point 314. As illustrated, reverse flexible circuit 350 continues vertically downward until it reaches the start 322 of the fine positioner loop 320.

Figure 4A:
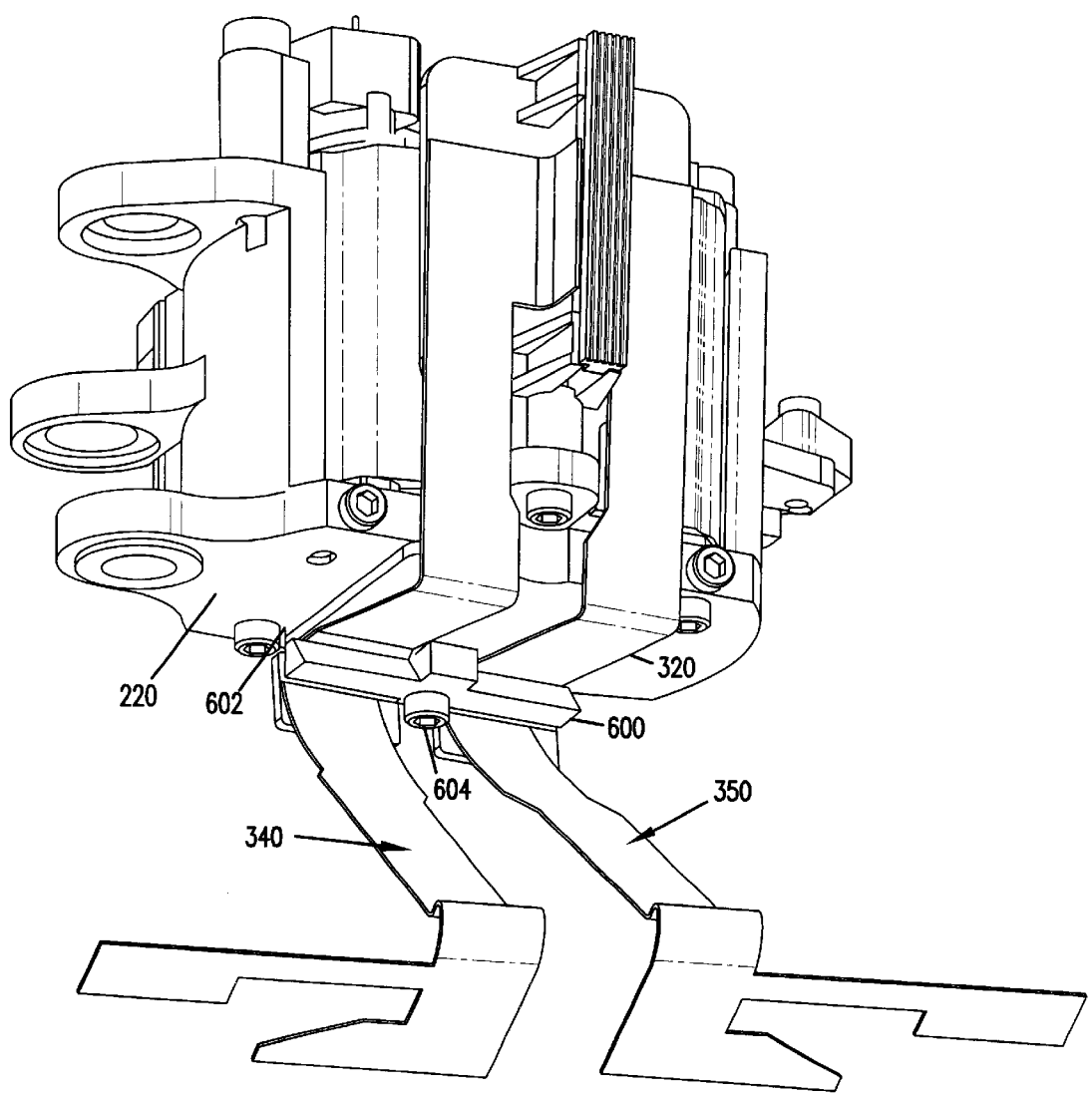
FIG. 4a is a perspective view of a positioner according to a second preferred embodiment of the present invention.
Figure 5:
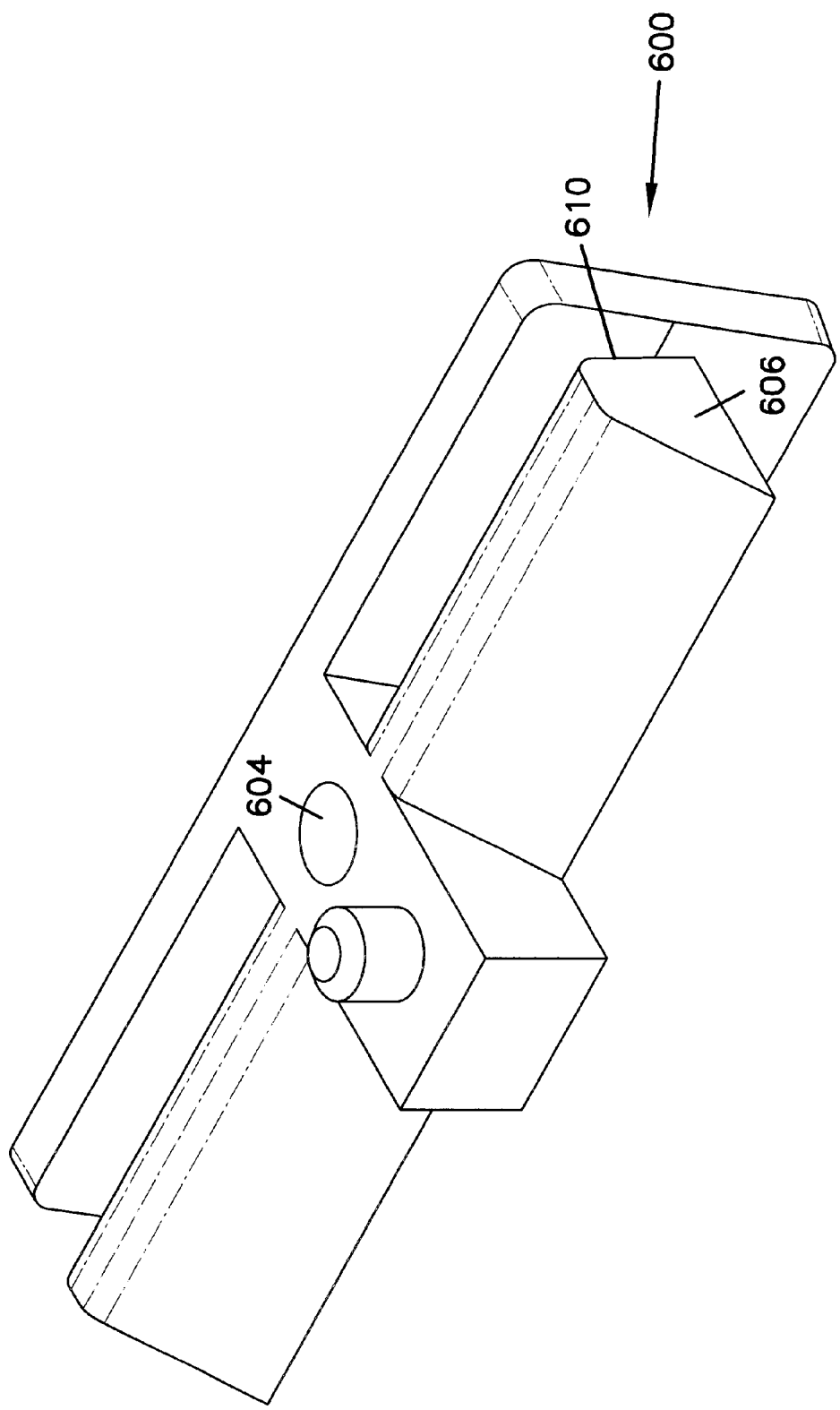
FIG. 5 is a perspective view of a positioner loop bracket used in conjunction with the posiitoner shown in FIGS. 4a and 4b according to a preferred embodiment of the present invention.

This first loop 320, i.e., the fine posiitoner loop, is designed to follow the short stroke of fine positioner 100. Fine positioner loop 320 functions much as a cantilever beam. As the moving mass represented by fine positioner 100 moves, the free end 322 of fine positioner loop 320 follows the moving mass. The shape of fine positioner loop 320 is formed such that it will add a minimum force to the overall force necessary to move the fine positioner suspension system. It can be seen in this preferred embodiment that the flexible circuits 340 and 350 each have a tab 315 that extends toward the other flexible circuit. Each tab 315 has a hole 317 formed therethrough. FIGS. 4*a* and 4*b* illustrate the positioner and flexible circuits 340, 350 mounted on a coarse positioner. In this preferred embodiment, the positioner is similar to that described with reference to FIGS. 1*a* and 2 except that a loop bracket 600 has been added to improve the precision with which the fine and coarse positioner loops are located. The bracket 600, shown in greater detail in FIG. 5, is attached to a bottom surface 602 of the coarse positioner bracket. 220. As previously described, each flexible printed circuit 340, 350 has a tab 315 with a hole 317 (see FIG. 3*a*) and the loop bracket 600 has corresponding hole 604. Preferably, both flexible circuits are secured between the loop bracket and the bottom surface of the coarse positioner bracket 220 by a screw 604.

Figure 4C:
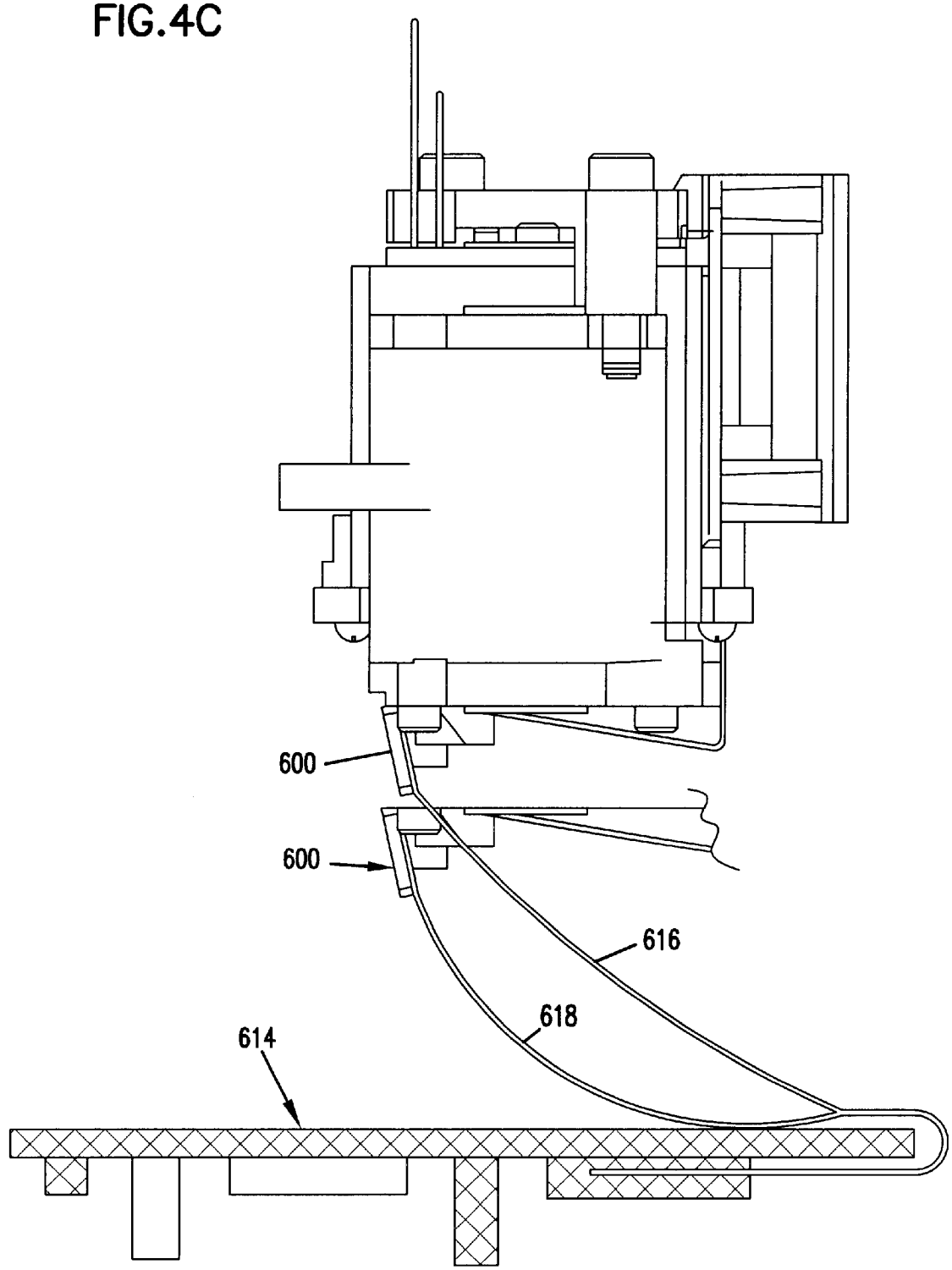
FIG. 4c is a side view of the positioner shown in FIG. 4a with the loop bracket attached.

As illustrated in FIGS. 4*a*, 4*b*, and 4*c* the fine positioner loop 320 terminates at the loop bracket 600. In FIG. 4*b* the loop bracket is not illustrated for purposes of clarity. The tabs on both flexible circuits 340 and 350 are fastened under the loop bracket 600 using preferably a screw. The location of the loop bracket and the hole on the tab on the flexible circuits provides the precise termination for the fine positioner loop. The flexible circuit wraps around the post 606 (see FIG. 5) which is part of the loop bracket 600 and the loop rests against an angled wall 610 of the loop bracket 600. The coarse posiitoner loop 330 begins at this angled wall located on the loop bracket. The coarse positioner loop continues as a curved line and forms a 180° turn 612 at the edge of the main printed circuit board 614. As shown in FIG. 4*b*, the loop changes from a curved line to a semi "U" shape as the coarse positioner moves from its upper position shown by curve 616 to its lower position shown by curve 618.

Figure 6:
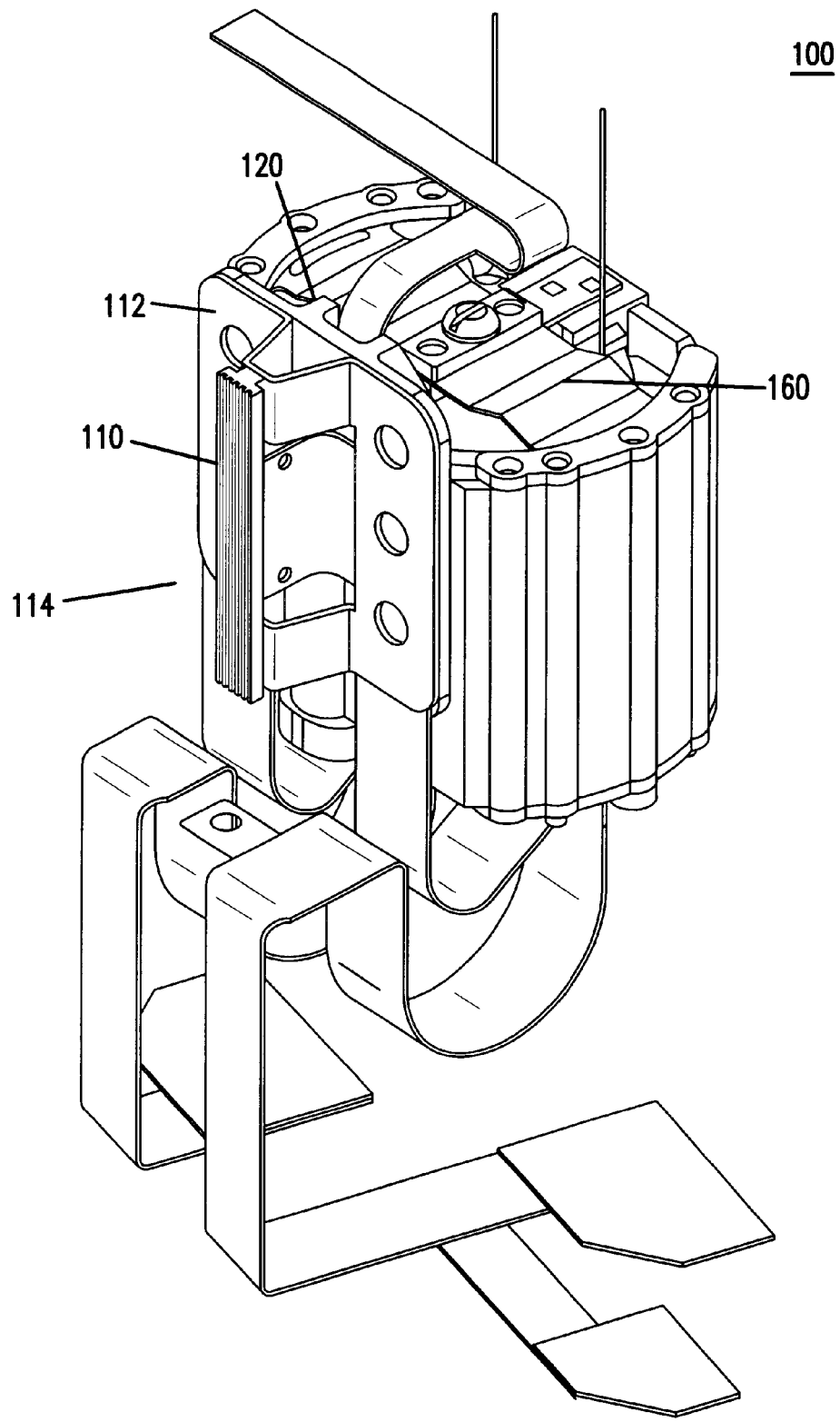
FIG. 6 is a perspective view of an alternate embodiment of a posiitoner according to a preferred embodiment of the invention.

FIG. 6 is a perspective view of a posiitoner according to another preferred embodiment of the present invention. In this embodiment, the coarse positioner loops of the flexible circuits are "U" shaped as compared with the coarse loops in the previous embodiments.

In summary, a first aspect of the invention is found in a method of increasing the transfer rate of a magnetic tape drive that has a fine positioner 100, a coarse positioned 200, and main control circuitry. The method includes providing a head 110 having at least one rail, wherein the rail has at least one head gap, mounting the head 110 in an assembly including a fine positioner 100 and a coarse positioned 200, and operatively connecting the head 110 to the main control circuitry of the tape drive via a flexible printed circuit 340, 350 that is configured to provide a predetermined level of stiffness.

Preferably, the method of increasing the transfer rate includes the step of providing a head 110 having two rails. In a preferred embodiment, the step of operatively connecting the head 110 to the main control circuitry of the tape drive via a flexible printed circuit 350, 350 includes the step of providing a loop 320 in said flexible printed circuit that corresponds to the stroke of the fine positioner 100 and further includes the step of providing a loop 330 in said flexible printed circuit that corresponds to the translation range of the coarse positioner 200.

A second aspect of the invention is found in a magnetic tape drive having an increased transfer rate. The drive includes a magnetic head 110 having a minimum of two rails, each rail having a plurality of head gaps; wherein the head 110 is arranged within and positioned by a head positioning apparatus. The drive also includes flexible printed circuits 340, 350 that provide communication between the magnetic head 110 and main control circuitry; wherein the flexible printed circuits 340, 350 have at least one loop that corresponds to the translation range of the head positioning apparatus.

Preferably, the tape drive includes a fine positioner 100 and a coarse positioner 200. In a preferred embodiment, the flexible printed circuit 340, 350 includes a loop 320 corresponding to the stroke of the fine positioner 100 and preferably also includes a loop 330 corresponding to the translation range of the coarse positioner 200. Each rail is preferably connected to main control circuitry via a flexible printed circuit 340, 350, wherein the head gaps present on one rail perform read operations while the head gaps present on the other rail perform write operations, thereby reducing crosstalk between the two circuits 340, 350.

An advantage of the design according to a preferred embodiment of the present invention is that it separates the forward and reverse flexible printed circuits. Both rails of the magnetic head have multiple gaps. During a write-read operation in the forward direction, the write is performed using the gaps in the forward rail while the read is performed using the gaps in the reverse rail. During a write operation, the circuits on the main printed circuit board sends signals though the forward flexible printed circuit. Immediately after the write operation is performed, the read heads on the reverse rail read the written information. Thus, the write current is present in the forward flexible circuits when the read current is present in the reverse flexible printed circuits. By separating the two flexible printed circuits, the possibility of electromagnetic interference between the two flexible circuits is severely reduced if not eliminated. The same is true when the tape motion is reversed. In this case, a write is performed using the reverse rail and a read is performed using the forward rail. The same advantage of reducing, if not eliminating, electromagnetic interference between the two flexible printed circuits is present.

A third aspect of the invention is found in a flex circuit for coupling a head 110 of a tape drive to a main circuit that provides translation commands to the head 110 of the tape drive. The flex circuit 340, 350 includes a fine positioner loop 320 having a shape that is designed to reduce stiffness in the flex circuit 340, 350 and a coarse positioner loop 330 coupled to the fine positioner loop 320, the coarse positioner loop 330 having a shape that is designed to reduce stiffness in the flex circuit 340, 350. Preferably, the coarse positioned loop 330 is U shaped or semi U shaped.

In a preferred embodiment, the flex circuit 340, 350 further includes a fixed end 332 located between the fine positioner loop 320 and the coarse positioned loop 330, wherein the fixed end 332 couples the fine and coarse positioner loops. The coarse positioner loop 330 can terminate in a second fixed end 334 that can be a 180° bend. Preferably, the flex circuit 340, 350 also includes connector pads 460 for coupling the flex circuit 340, 350 to the main circuit.

It will be clear that the present invention is well adapted to attain the ends and advantages mentioned as well as those inherent therein. While a presently preferred embodiment has been described for purposes of this disclosure, numerous changes may be made which will readily suggest themselves to those skilled in the art and which are encompassed in the spirit of the invention disclosed and as defined in the appended claims.

What is claimed is:

1. A method of increasing the transfer rate of a magnetic tape drive comprising a fine positioner and a coarse positioner, the tape drive further comprising main control circuitry, the method comprising steps of:
   (a) providing a head comprising least one rail, wherein the rail has at least one head gap;
   (b) mounting the head in an assembly comprising the fine positioner and the coarse positioner, and
   (c) operatively connecting the head to the main control circuitry of the tape drive via a flexible printed circuit board, the flexible printed circuit board having:
      (i) a first connection portion connecting the flexible printed circuit board to the head;
      (ii) a second connection portion connecting the flexible printed circuit board to the main control circuitry, and
      (iii) a third connection portion located intermediate the first and second connection portions;
   (d) coupling the connection portions of the flexible printed circuit board to the assembly to form a fine positioner loop and a coarse positioner loop, wherein:
      (i) the fine positioner loop commences at the first connection portion coupled to the head and terminates at the third connection portion coupled to the assembly; and
      (ii) the course positioner loop commences at the third connection portion coupled to the assembly and terminates at the second connection portion coupled to the main control circuitry.

2. The method of claim 1 further comprising the step of providing a head having two rails.

3. The method of claim 1 wherein the fine positioner loop corresponds to the stroke of the fine positioner.

4. The method of claim 1 wherein the coarse positioner loop corresponds to the translation range of the coarse positioner.

5. A magnetic tape drive having an increased transfer rate, said drive comprising:
   (a) a magnetic head assembly, comprising:
      (i) a magnetic head comprising a minimum of two rails, each rail having a plurality of head gaps; and
      (ii) a head positioning apparatus, wherein the head is arranged within and positioned by the head positioning apparatus;
   (b) a flexible printed circuit that provides communication between the magnetic head and main control circuitry, the flexible printed circuit having:
      (i) a first connection portion connecting the flexible printed circuit to the magnetic head;
      (ii) a second connection portion connecting the flexible printed circuit to the main control circuitry; and
      (iii) a third connection portion, located intermediate the first and second connection portions;
   (c) a bracket for coupling the third connection portion of the flexible printed circuit to the head positioning apparatus, wherein the bracket divides the flexible printed circuit into a fine positioner loop and a coarse positioner loop, the fine positioner loop commencing at the first connection portion and terminating at the third connection portion, the coarse positioner loop commencing at the third connection portion and terminating at the second connection portion.

6. The tape drive of claim 5 wherein the head positioning apparatus comprises a fine positioner and a coarse positioner.

7. The tape drive of claim 5 wherein each rail is operatively connected to the main control circuitry via the flexible printed circuit.

8. The tape drive of claim 9 wherein the head gaps present on one rail perform read operations while the head gaps present on the other rail perform write operations, thereby reducing crosstalk between the two circuits.

9. The tape drive of claim 5 wherein the bracket for coupling comprises a loop bracket about which the flexible printed circuit is wrapped for precisely positioning the flexible printed circuit.

10. A flex circuit for coupling a head of a tape drive to a main circuit that provides translation commands to the head of the tape drive, the flex circuit comprising:
    (a) a fine positioner loop having a shape that is designed to reduce stiffness in the flex circuit, the fine positioner loop commencing at the head of the tape drive and terminating at a coupler; and
    (b) a coarse positioner loop having a shape that is designed to reduce stiffness in the flex circuit, the coarse positioner loop commencing at the coupler and terminating at the main circuit.

11. The flex circuit of claim 10 wherein the coarse positioner loop is U shaped.

12. The flex circuit of claim 10 wherein the coarse positioner loop is semi U shaped.

13. The flex circuit of claim 10 wherein the coupler fixes an intermediate portion of the flex circuit located between the fine positioner loop and the coarse positioner loop, the fixed intermediate portion demarking the respective termination and commencement of the the fine and coarse positioner loops.

14. The flex circuit of claim 13 wherein the course positioner loop commences at a first fixed end and terminates at a second fixed end.

15. The flex circuit of claim 14 wherein the second fixed end is a 180° bend.

16. The flex circuit of claim 10 further comprising connector pads for coupling the flex circuit to the main circuit.

17. The flex circuit of claim 10 further comprising a loop bracket attachment for precisely positioning the flex circuit to a loop bracket of the tape drive.

18. A magnetic tape drive having an increased transfer rate, said drive comprising:
    (a) a magnetic head comprising a minimum of two rails, each rail having a plurality of head gaps, wherein the head is arranged within and positioned by a head positioning apparatus; and
    (b) a flexible painted circuit that provides communication between the magnetic head and main control circuitry wherein the flexible printed circuit is located under the magnetic head, the flexible printed circuit including:
        (i) a first connection portion connecting the flexible printed circuit to the magnetic head;
        (ii) a second connection portion connecting the flexible printed circuit to the main control circuitry; and
        (iii) means for coupling a third connection portion of the flexible printed circuit to the head positioning apparatus such that the means for coupling divides the flexible printed circuit into a fine positioner loop and a coarse positioner loop, the means or coupling further defining the termination of the fine positioner loop and the commencement of the coarse positioner loop.

19. A magnetic tape drive having an increased transfer rate, said drive comprising:
    (a) a magnetic head comprising a minimum of two rails, each rail having a plurality of head gaps, wherein the head is arranged within and positioned by a head positioning apparatus; and
    (b) a flexible printed circuit that provides communication between the magnetic head and main control circuitry wherein the flexible printed circuit is located under the magnetic head, the flexible printed including:
        (i) a first connection portion connecting the flexible printed circuit to the magnetic head;
        (ii) a second connection portion connecting the flexible printed circuit to the main control circuitry;
        (iii) a tab located at a position between the first and second connection portions of the flexible printed circuit, the tab being secured onto the head positioning apparatus and defining the commencement of a coarse positioner loop and the termination of a fine positioner loop.

20. A magnetic tape drive having an increased transfer rate, the drive comprising:
    a head positioning device on which a magnetic head is mounted;
    a flexible printed circuit having a first end and a second end, the first end of the flexible printed circuit coupled to the head positioning device, the second end of the flexible printed circuit coupled to a main circuit wherein the first end is located under the magnetic head so that the head can be moved up and down without interfering with a tape; and
    a bracket attached to the head positioning device, the bracket constructed for coupling a portion intermediate the first end and the second end of the flexible printed circuit so that the bracket divides the flexible printed circuit into a fine positioner loop and a coarse positioner loop.

* * * * *

UNITED STATES PATENT AND TRADEMARK OFFICE
CERTIFICATE OF CORRECTION

PATENT NO. : 6,404,598 B1
DATED : June 11, 2002
INVENTOR(S) : Nayak et al.

It is certified that error appears in the above-identified patent and that said Letters Patent is hereby corrected as shown below:

<u>Title page,</u>
Item [56], References Cited, U.S. PATENT DOCUMENTS,
Insert -- 5,191,492, 03/02/1993, Nayak et al. -- in appropriate order.
Insert -- 5,660,345, 08/26/1997, Buckland et al. -- in appropriate order.
Insert -- 5,833,161, 11/10/1998, Nayak et al. -- in appropriate order.
Insert -- 5,868,333, 02/09/1999, Nayak et al. -- in appropriate order.
Insert -- 5,901,008, 05/04/1999, Nayak et al. -- in appropriate order.
Insert -- 5,940,238, 08/17/1999, Nayak et al. -- in appropriate order.

<u>Column 6,</u>
Line 17, "positioned" should read -- positioner --
Line 21, "positioned" should read -- positioner --

<u>Column 8,</u>
Line 43, "claim 9" should read -- claim 5 --

<u>Column 9,</u>
Line 21, "painted" should read -- printed --

<u>Column 10,</u>
Line 8, insert -- circuit -- after the word "printed"

Signed and Sealed this

Twenty-fourth Day of December, 2002

JAMES E. ROGAN
*Director of the United States Patent and Trademark Office*